(12) United States Patent
Volkening et al.

(10) Patent No.: US 7,199,607 B2
(45) Date of Patent: Apr. 3, 2007

(54) PIN MULTIPLEXING

(75) Inventors: Ingo Volkening, Singapore (SG); Hong Lee Koo, Singapore (SG); Jasmeet Singh Narang, Singapore (SG); Jiaxiang Shi, Singapore (SG)

(73) Assignee: Infineon Technologies AG, Munich (DE)

( * ) Notice: Subject to any disclaimer, the term of this patent is extended or adjusted under 35 U.S.C. 154(b) by 100 days.

(21) Appl. No.: 11/020,633

(22) Filed: Dec. 22, 2004

(65) Prior Publication Data

US 2006/0132178 A1 Jun. 22, 2006

(51) Int. Cl.
*H03K 19/173* (2006.01)
(52) U.S. Cl. .......................................... 326/38; 326/104
(58) Field of Classification Search ............. 326/38–41
See application file for complete search history.

(56) References Cited

U.S. PATENT DOCUMENTS

| 6,034,542 | A | * | 3/2000 | Ridgeway ..................... 326/39 |
| 6,052,754 | A | * | 4/2000 | Anand ......................... 710/305 |
| 6,285,211 | B1 | | 9/2001 | Sample et al. |
| 6,735,643 | B2 | * | 5/2004 | Chang et al. .................. 710/26 |
| 2005/0050283 | A1 | * | 3/2005 | Miller et al. ................. 711/150 |
| 2005/0200390 | A1 | * | 9/2005 | Starr et al. ................... 327/156 |

\* cited by examiner

*Primary Examiner*—Don Le
(74) *Attorney, Agent, or Firm*—Slater & Matsil, L.L.P.

(57) ABSTRACT

There is provided a semiconductor device for multiplexing across a plurality of shared Input/Output (I/O) pins. The semiconductor device comprises a first core for operation of a first function, a second core for operation of a second function, a multiplexer and an additional hardware module. The multiplexer is arranged to set the I/O pins to the first function or to the second function at power up. The hardware module comprises an arbiter arranged to receive requests from the cores for use of the I/O pins and to grant use of the I/O pins to a selected core as required. Thus, the hardware module can switch functions dynamically and dual mode multiplexing is enabled.

17 Claims, 3 Drawing Sheets

PIN MULTIPLEXING

TECHNICAL FIELD

The invention relates to semiconductor devices for pin multiplexing across a plurality of I/O (Input/Output) pins, and their method of operation.

BACKGROUND

For a rich I/O interface on an integrated circuit, pin multiplexing is often required because the number of pins is limited. Several functions need to exist through one multiplexed interface.

FIG. 1 shows a known arrangement for pin multiplexing in a rich I/O interface. FIG. 1 shows a first core 101 and a second core 103, each linked to a shared I/O multiplexer 105. The two cores 101 and 103 together with the multiplexer 105 are located on a semiconductor chip. The shared I/O multiplexer 105 multiplexes between a set of shared pins 107.

In the arrangement described with reference to FIG. 1, the shared I/O multiplexer switches the multiplexed interface to the appropriate function at power up. That is, the I/O multiplexer selects the appropriate core 101 or 103 at start up. Thus, at any given time only one of the functions is working. Also, change to a different function is not possible without a restart and there are only limited choices for I/O functions to be multiplexed.

SUMMARY OF THE INVENTION

In one aspect, the invention provides a semiconductor device and hardware for the semiconductor device, which mitigates or substantially overcomes the problems of prior art arrangements described above. In a further aspect, the invention provides a method of operation of a semiconductor device, which mitigates or substantially overcomes the problems of prior art arrangements described above.

In general terms, the preferred embodiment of the invention proposes that, on a semiconductor device, in addition to the conventional shared multiplexer that selects the appropriate function at power up, there be provided additional hardware which is able to multiplex dynamically, that is, to switch between functions on the fly rather than only at power up. The hardware comprises an arbiter that is arranged to arbitrate between the various functions that need to use the set of shared pins.

More specifically, according to a first aspect of the invention, there is provided a semiconductor device for multiplexing across a plurality of Input/Output (I/O) pins, the semiconductor device comprising a first core for operation of a first function, a second core for operation of a second function, a multiplexer arranged to set the I/O pins to the first function or to the second function at power up, and a hardware module comprising an arbiter arranged to receive requests from the cores for use of the I/O pins, and to grant use of the I/O pins to a selected core, as required.

The multiplexer is arranged to set the I/O pins to a particular function at power up. The hardware module, on the other hand, is arranged to switch operation of the pins between functions, as and when required, by instructing the multiplexer to switch to a different function. Thus, with the provision of the hardware module, the functions can be switched without a power restart. In addition, with the hardware module, the two functions can exist at the same time, i.e., dual mode multiplexing is enabled. The hardware module allows dynamic multiplexing between functions. The arbiter is simply a portion of hardware, forming part of the hardware module, which arbitrates between the functions and decides how to allocate use of the I/O pins via controlling the multiplexer.

In an embodiment of the invention, the hardware module is operable at a first logic setting or a second logic setting, wherein, at the first logic setting, the I/O pins are set to the function selected by the multiplexer at power up and, at the second logic setting, the arbiter sets the I/O pins to the function of the selected core.

Thus, when the logic is at the first setting, the I/O pins are set to the power up function and there is no switching between functions as and when required. It may be the case that the semiconductor device is required to boot up from a particular function. Thus, the first logic setting will be set at power up so that the required boot up function can be selected by the multiplexer.

On the other hand, when the logic is at the second setting, the arbiter can set the I/O pins to the selected function as the particular core activates. That is, at that logic setting, dynamic switching between functions is enabled. The logic setting may be programmable by software.

The arbiter may be arranged to set the I/O pins to the function of the selected core as required, either before or after the core is granted use of the I/O pins. This may be done by the arbiter communicating with the multiplexer. That may involve the arbiter instructing the multiplexer to set the I/O pins to the function of the selected core.

The hardware module may further comprise an interface for one or each core for communicating with the arbiter. An interface may be required for certain functions. In one embodiment of the invention, one of the functions is Flash (a well known memory type) and the interface is a modified Flash arbiter.

The multiplexer may be arranged to set the I/O pins to a preselected one of the first function and the second function at power up. In one embodiment of the invention, the preselected function may be Flash. Putting it another way, the semiconductor device will always boot up from Flash.

The multiplexer may be of a known type, which may be a type used for conventional multiplexing.

In one advantageous embodiment, the semiconductor device is arranged to operate with a third core for operation of a third function. The third core may be located on or off the semiconductor device. Thus, the hardware module can switch between the first, second and third functions without a power restart; triple mode multiplexing is enabled. In that embodiment, the multiplexer is preferably arranged to set the I/O pins to a preselected one of the first function, the second function and the third function at power up.

The functions of the cores may be selected from Flash, PCI, Cardbus, PC-Card (standard bus arrangements) MII and Utopia (standard interfaces).

In one embodiment, at least one of the functions is operable via pins dedicated to that function. That is, the function may be operable via the dedicated pins and/or via the shared pins.

In one embodiment, each request from a core comprises an active signal from the core to the arbiter. The signal may be called a request signal. When the request signal is active for a particular core, that core is making a request to the arbiter for use of the I/O pins. When the request signal is inactive, the core is not making such a request. In one preferred arrangement, the request signal is active when it is at low (0) voltage and inactive when it is at high (1) voltage.

In one embodiment, each grant to a selected core comprises an active signal from the arbiter to the selected core. The signal may be called a grant signal. When the grant signal is active to a selected core, the arbiter is granting use of the I/O pins to the selected core. The grant signal may remain active as long as use of the I/O pins is granted to that core (even if the core no longer requires use of the I/O pins), simply because no other core has made a request to the arbiter. In one preferred arrangement, the grant signal is active when it is at low (0) voltage and inactive when it is a high (1) voltage.

According to the first aspect of the invention, there is also provided a semiconductor device for multiplexing across a plurality of Input/Output (I/O) pins, the semiconductor device comprising a Flash core; a PCI (Peripheral Component Interconnect) core; a multiplexer arranged to set the I/O pins to Flash function at power up; and a hardware module comprising a PCI arbiter and a modified Flash arbiter, the PCI arbiter arranged to receive requests from the Flash core and the PCI core for use of the I/O pins and to grant use of the I/O pins to a selected core as required, the modified Flash arbiter being arranged to interface between the Flash core and the PCI arbiter.

According to a second aspect of the invention, there is provided a hardware module for a semiconductor device for multiplexing across a plurality of Input/Output (I/O) pins, the semiconductor device comprising a first core for operation of a first function, a second core for operation of a second function and a multiplexer arranged to set the I/O pins to the first function or to the second function at power up, the hardware module comprising an arbiter arranged to receive requests from the cores for use of the I/O pins and to grant use of the I/O pins to a selected core, as required.

The hardware module is arranged to switch operation of the pins between functions, as and when required. Thus, the hardware module allows the functions to be switched without a power restart. In addition, two functions can co-exist, i.e., dual mode multiplexing is enabled. The hardware module allows dynamic multiplexing between functions.

In one embodiment, the hardware module is operable at a first logic setting or a second logic setting wherein, at the first logic setting, the I/O pins are set to the function selected by the multiplexer at power up and, at the second logic setting, the arbiter sets the I/O pins to the function of the selected core.

Thus, when the logic is at the first setting, the I/O pins are set to the power up function and there is no switching between functions as and when required. It may be the case that the semiconductor device is required to boot up from a particular function. Thus, the first logic setting will be set at power up so that the required boot up function can be selected by the multiplexer.

On the other hand, when the logic is at the second setting, the arbiter can set the I/O pins to the selected function as that particular core activates. That is, at that logic setting, dynamic switching between functions is enabled. The logic setting may be programmable by software.

The arbiter may be arranged to set the I/O pins to the function of the selected core as required, either before or after the core is granted use of the I/O pins. This may be done by the arbiter communicating with the multiplexer, which may involve the arbiter instructing the multiplexer to set the I/O pins to the selected function.

In one embodiment, the hardware module further comprises an interface for one or each core for communicating with the arbiter. An interface may be required for certain functions.

In one particular arrangement, the two functions are Flash (a well known memory type) and PCI (Peripheral Component Interconnect—a standard bus arrangement). In that arrangement, the arbiter may be a PCI arbiter. The Flash core then requires an interface for communication between the Flash core and the PCI arbiter. The interface may be a modified Flash arbiter.

In one embodiment, the semiconductor device is arranged to operate with a third core for operation of a third function. The third core may or may not be located on the semiconductor device itself. In that embodiment, the arbiter is preferably arranged to receive requests from the first, second and third cores for use of the I/O pins, to grant use of the I/O pins to a selected core of the first, second and third cores and to set the I/O pins to the function of the selected core as required. Thus, the hardware module can switch between the first, second and third functions without a power restart. Triple mode multiplexing is enabled.

According to a third aspect of the invention, there is provided a method for multiplexing across a plurality of Input/Output (I/O) pins, between a first core and a second core on a semiconductor device, the first core being arranged for operation of a first function, the second core being arranged for operation of a second function, the method comprising the steps of:

a) providing a hardware module on the semiconductor device, the hardware module comprising an arbiter;

b) the first core and/or the second core sending a request to the arbiter for use of the I/O pins;

c) the arbiter granting the request of a selected core; and d) the selected core receiving and/or sending data over the I/O pins.

The method allows the I/O pins to be allocated to a particular function as and when required. Thus, a power restart is not required for a switch between functions.

The method may further comprise, before step d), the step of the arbiter setting the I/O pins to the function of the selected core. In that case, the step of the arbiter setting the I/O pins to the function of the selected core may comprise the arbiter instructing a pin multiplexer to set the I/O pins to the function of the selected core.

In one embodiment, step b) comprises the first core and/or the second core setting a request signal to active. The request signal may be received by the arbiter. In that way, the arbiter will receive an indication that the core wants to use the I/O pins to receive and/or send data. In one arrangement, the request signal is active when it is at low (0) voltage and inactive when it is at high (1) voltage.

Preferably, step c) comprises the arbiter setting a grant signal active for the selected core. Once the grant signal is set active for the selected core, the selected core will have an indication that it can use the I/O pins to send and/or receive data. In one arrangement, the grant signal is active when it is at low (0) voltage and inactive when it is at high (1) voltage.

In one embodiment, the method further comprises, before step d), the step of the selected core setting a busy signal to active. The selected core may maintain the busy signal active while the selected core sends and/or receives data over the I/O pins. Thus, when the busy signal for a particular core is active, that core is making use of the I/O pins to send and/or receive data. In one arrangement, the busy signal is active when it is at low (0) voltage and inactive when it is at high (1) voltage.

In one embodiment, the core sets the busy signal to inactive once step d) is complete.

In one advantageous embodiment, the method comprises a method for multiplexing between a first core and a second core and a third core, the third core being for operation of a third function. In that case, step b) may comprise the first core and/or the second core and/or the third core sending a request to the arbiter for use of the I/O pins. The third core may be located on or off the semiconductor device. Thus, in this embodiment, the method allows triple mode multiplexing.

Any feature described in relation to one aspect of the invention may also be applicable to another aspect of the invention.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, of which.

DETAILED DESCRIPTION OF ILLUSTRATIVE EMBODIMENTS

Figure 1:
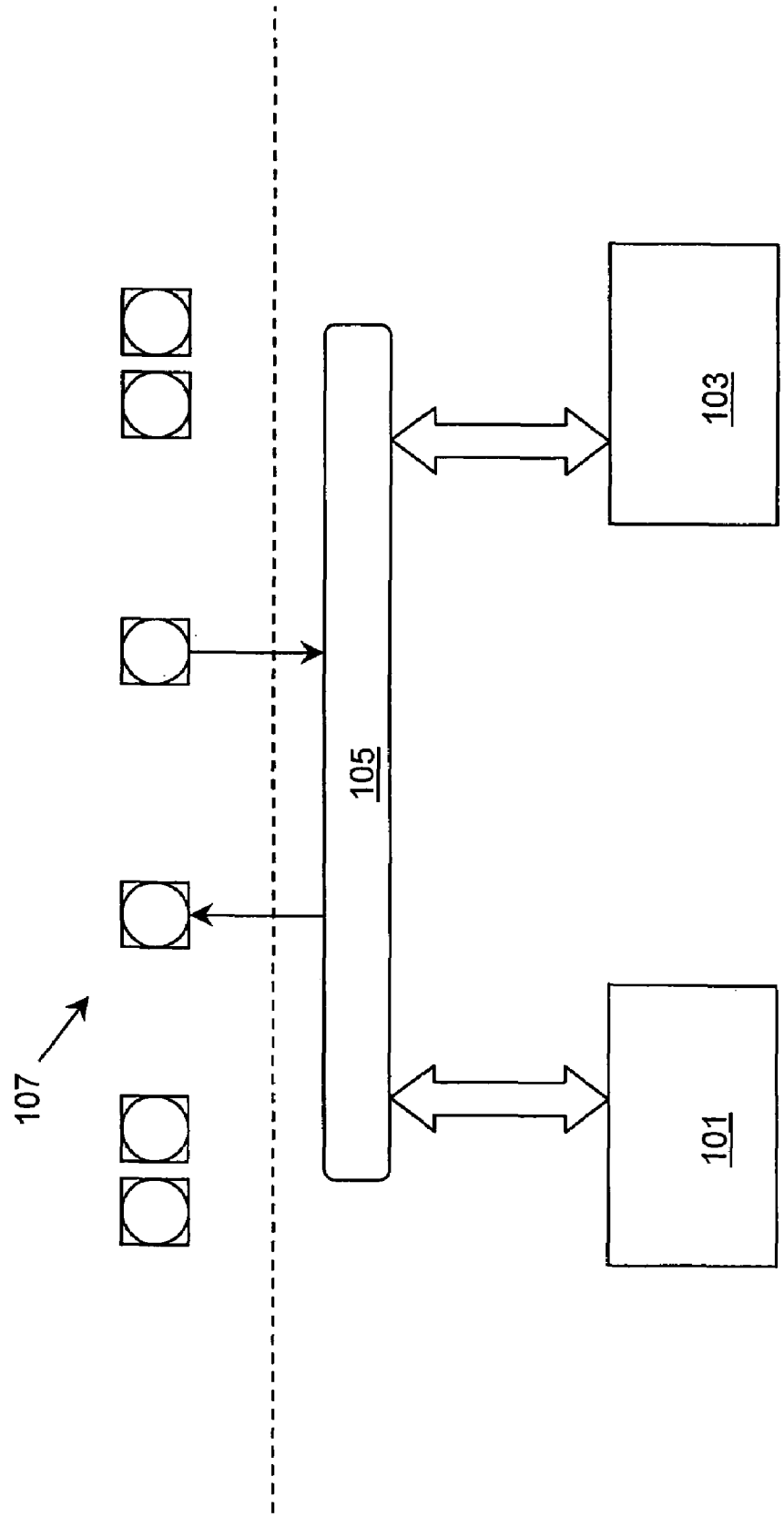
FIG. 1 shows a known arrangement for pin multiplexing in a rich I/O interface.
Figure 2:
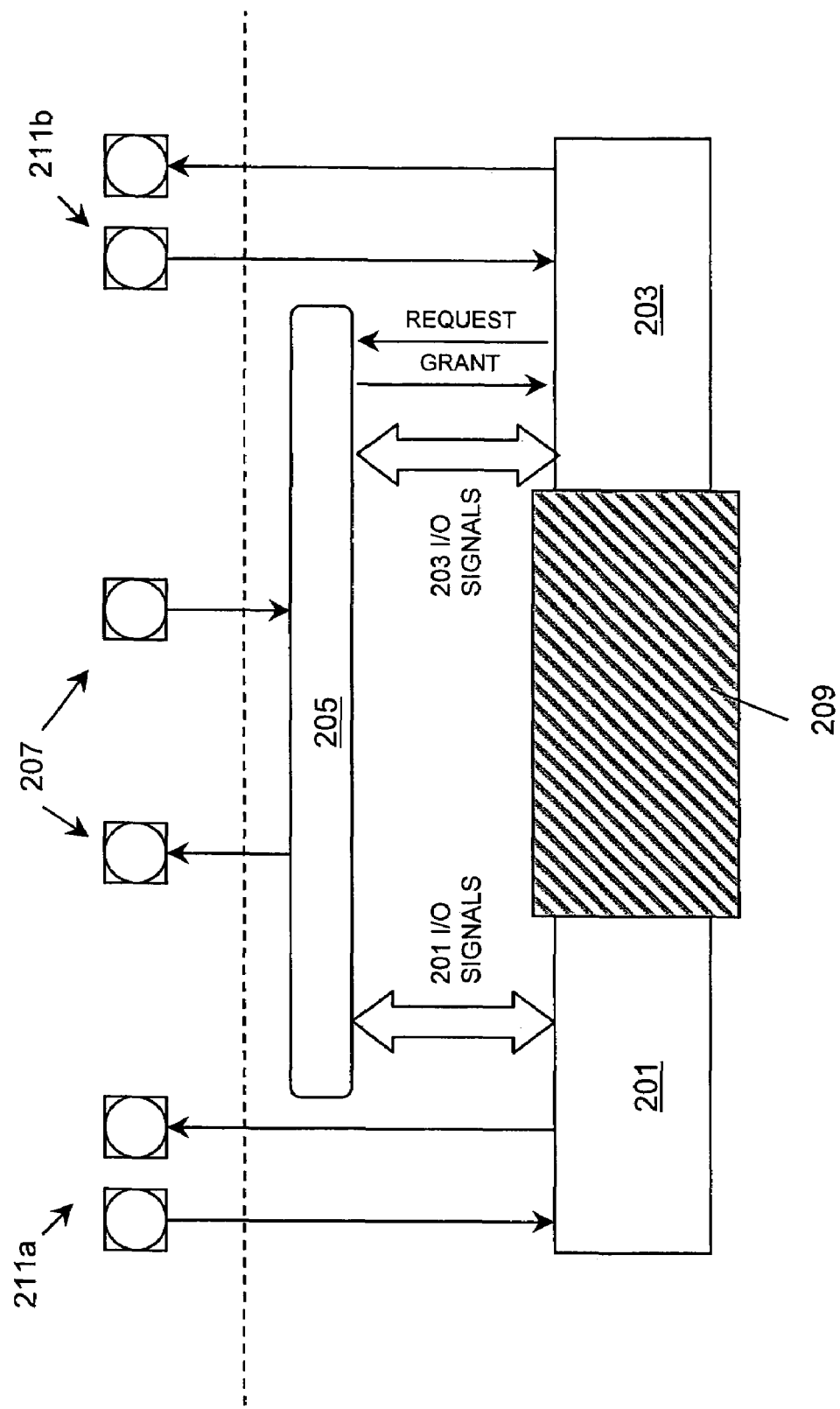
FIG. 2 is a schematic diagram of a pin multiplexing arrangement according to an embodiment of the invention.

FIG. 2 shows an arrangement for pin multiplexing according to an embodiment of the invention. As in the known arrangement illustrated in FIG. 1, the arrangement includes a first core 201 and a second core 203, each linked to a shared I/O multiplexer 205, which multiplexes between a set of shared pins 207. In the arrangement, first core 201 is a Flash core and second core 203 is a PCI core. Flash is a well known memory type and PCI (Peripheral Component Interconnect) is a standard 32-bit bus. Other core types, for example PC-Card (a standard 16-bit bus) and Cardbus (a standard 32-bit bus) are also possible. The arrangement additionally includes a hardware module in the form of core manager hardware 209, the operation of which will be described below. Also shown in this embodiment are a number of dedicated pins 211a and 211b. The two cores 201 and 203 together with core manager hardware 209 and the multiplexer 205 are located on a semiconductor chip.

The shared I/O multiplexer 205 works in the same way as in the conventional arrangement shown in FIG. 1. That is, the shared I/O multiplexer switches the multiplexed interface to the appropriate function at power up. In this particular arrangement, the function at start up is always Flash, as will be described below.

However, the arrangement additionally includes core manager hardware 209. The function of the core manager hardware is to arbitrate between the functions across the set of shared pins 207. The core manager hardware automatically switches the pins function (by instructing the multiplexer) as that particular core activates. Thus, although the multiplexer 205 works in the same way as in conventional arrangements, provision of the core manager hardware 209 means that the shared pins can switch functions on the fly, without the need for a power restart.

The dedicated pins 211a and 211b are dedicated to particular functions, 211a dedicated to the Flash core and 211b dedicated to the PCI core. Those dedicated pins are not shared, i.e., the multiplexer does not multiplex between those pins. The dedicated pins will be discussed further below.

Figure 3:
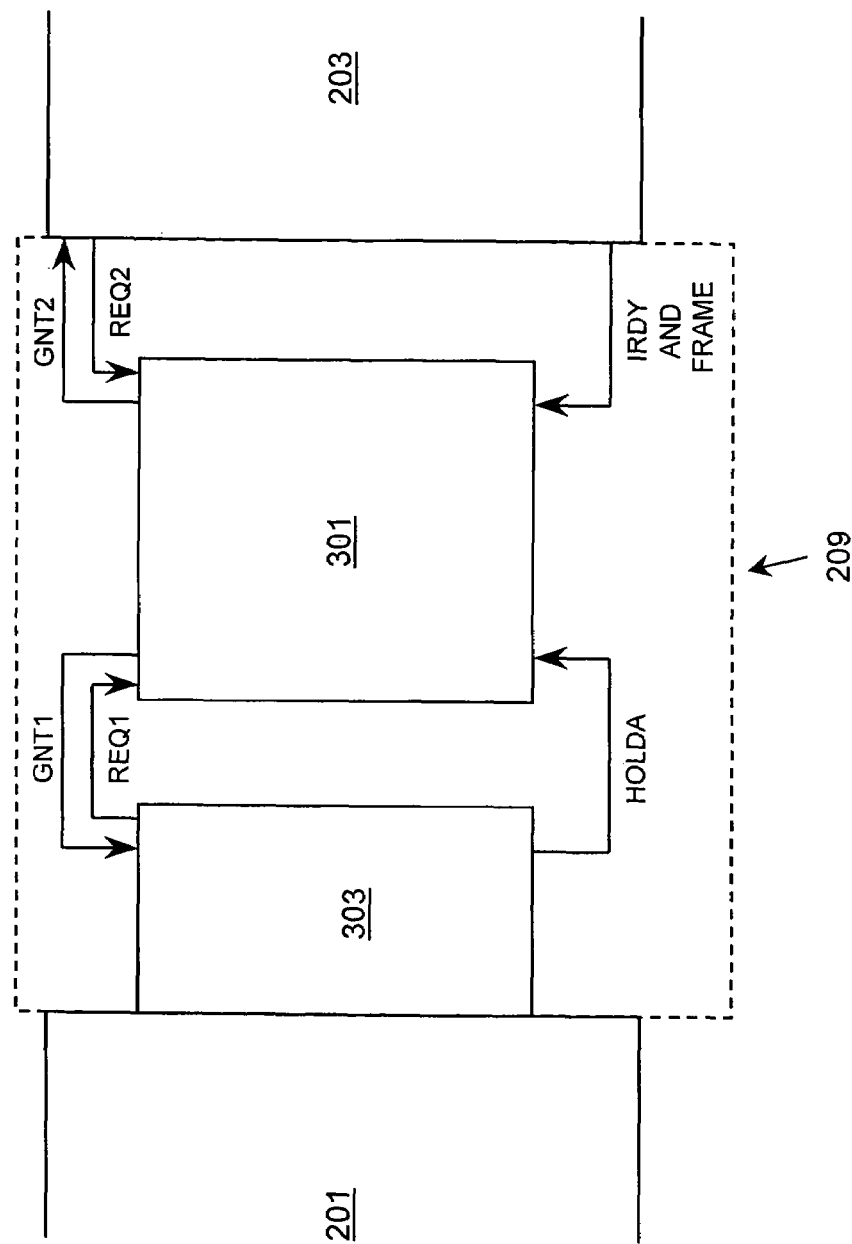
FIG. 3 is a detailed diagram of the core manager hardware of FIG. 2.

The core manager hardware 209 according to this embodiment is illustrated in FIG. 3. The role of the core manager hardware is to arbitrate between the various functions for the set of shared pins 207.

The core manager hardware includes a PCI arbiter 301 for arbitrating between Flash core 201 and PCI core 203. In order to send requests to the PCI arbiter 301, the Flash core 201 requires a Flash interface 303. The PCI core 203, on the other hand, can send requests without the need for an interface. (In one arrangement, the Flash interface is just a standard Flash arbiter modified, by glue logic, to be able to communicate with the PCI arbiter. This is convenient because a Flash arbiter is a standard IP core which has proven capability.)

The Flash interface 303 has three signals: 1) request signal (REQ1) output, 2) busy signal (HOLDA) output, and 3) grant signal (GNT1) input. The HOLDA output indicates whether the Flash is holding (active) or releasing (inactive) the bus.

The PCI core has three signals: 1) request signal (REQ2) output, 2) busy signal (IRDY AND FRAME) output, and 3) grant signal (GNT2) input. IRDY and FRAME are standard signals for a PCI interface to indicate whether the PCI bus is busy or idle. If either IRDY or FRAME is active, this will indicate that the PCI bus is busy.

The request signal is set active when a core requests use of the shared pins. The grant signal is set active when the PCI arbiter grants a particular core its request. The busy signal is set active when the core is actually performing a transaction. Therefore, the grant signal may be set active even when the transaction is complete, simply because no other core has made a request. In one arrangement, the signals are considered active when they are low (0) and inactive when they are high (1).

The PCI arbiter 301 can receive up to three request signals which means that there may be a third core outside the chip (and not shown in FIG. 2). The third core may also have request and busy output signals and a grant input signal. In one arrangement, the third core is also a PCI interface, with different REQ and GNT signals but the same IRDY and FRAME signals. In an alternative arrangement, the third core is Cardbus.

As mentioned above, the boot up in this particular arrangement is always from Flash. When HOLDA is active (i.e., the Flash interface is sending a busy signal to the PCI arbiter) the shared pins are assigned to the Flash core 201. Otherwise, the shared pins are assigned to one of the other cores, either PCI core 203 or third core (not shown).

As already discussed, the role of the core manager hardware 209 is to arbitrate between the cores and switch the shared pins to the appropriate function. So, when a core needs to receive or send data over the shared pins, the core sends a request to the arbiter to be allotted use of the shared pins. The core will grant that request if appropriate. The particular steps involved in the arbitration are set out below:

Core x makes a request to the PCI arbiter, i.e., sets its REQ signal active;

The PCI arbiter removes any granted request from another core, i.e., sets any existing GNT signals inactive;

The PCI arbiter waits until busy signals from all the cores are inactive, i.e., until transactions in the other cores are complete;

The PCI arbiter issues a grant to Core x, i.e., sets the GNT signal active for that core;

Core x sets its busy signal active and, while the busy signal is active, core x performs its transaction across the shared I/O pins;

Once the transaction is complete, the PCI core will set its FRAME and IRDY signals to inactive regardless of whether the GNT remains active. On the other hand, the Flash core, once the transaction is complete, will set its HOLDA to inactive only if the GNT is now inactive. Otherwise, it will retain the HOLDA signal active.

When the PCI is using the I/O pins to perform a transaction, any control signals on the shared pins are all set to high. So, the default position for the control signals is high, if no cores are driving the signals. However, when Flash, for example, is using the shared pins, the control signals may be set to low. Thus, when the operation changes from non-PCI to PCI, the pull-up resistor on the system board will need to charge up the control signals from 0 to 1. The charge up time will depend on the resistor value R and capacitor value C on the system board, as follows:

$$V_c = V_s(1-e^{-t/RC})$$

$$V_c/V_s = 1 - e^{-t/RC}$$

$$e^{-t/RC} = 1 - V_c/V_s$$

Time constant, $t/RC = -\ln(1 - V_c/V_s)$

In a typical case, $V_c$ (the charge up voltage we want to achieve)=2.4 V and $V_s$ (the supplied voltage)=3.3 V. In that case, the time constant, t/RC is 1.299. Typically, R=3.3 kΩ and C=30 pF. This gives t=116.9 ns, i.e., charge up time will typically be more than 100 ns.

This charge up time is equivalent to about 4 cycles at 29 MHz or 8 cycles at 58 MHz. This number of cycles for charge up is not acceptable.

To solve this problem, when the hardware switches from a non-PCI interface (where control signals may be low) to the PCI interface (where all the control signals must be set to high), the non-PCI interface drives the signals to high. Thus, the control signals are guaranteed to be high after switching and the charging time is reduced so that cycles are not wasted. This can help avoid malfunction of the PCI devices.

As already mentioned, the arrangement always needs to boot up from Flash, i.e., the Flash interface needs to be selected by default at power up. To achieve this, the PCI arbiter includes control logic ACTRL. The default for ACTRL is 0.

When ACTRL is at 0, the default core is Flash, i.e., PCI arbiter has no effect on which function uses the shared pins. The shared pins are allocated to the function set at start up (Flash) just as in conventional arrangements. When ACTRL is set to 1, the PCI arbiter is enabled so the dynamic multiplexing function can take effect. Then, the arbitration between the functions as described above can proceed. The ACTRL is a register value which is programmable via software. The ACTRL does not change dynamically.

In summary, operation of the arrangement of FIG. 2 is as follows. At power up, ACTRL is set to 0 in the PCI arbiter, which means that dynamic multiplexing is not enabled and the default operating core is the Flash. At that time, the arrangement works like a conventional arrangement, the operating core being set at start up. However, once the ACTRL is set to 1, the PCI arbiter is enabled and arbitration between Flash, PCI and any third core (for example PC Card or Cardbus) may proceed according to the steps described above (with the PCI function taking precedent as described).

In FIG. 2, note that there are a number of dedicated or static pins 211. These pins may be dedicated to a particular function and are not involved in multiplexing. Possible dedicated interfaces are MII and Utopia. The dedicated pins are outside the scope of the invention; FIG. 2 simply shows that may exist alongside the arrangement according to the invention.

It can be seen from the above arrangement that the invention overcomes the pin (also termed pad or ball) limitation of a low cost package. It saves board space and hence reduces manufacturing costs. We see that the arbitration mechanism in the hardware mechanism allows dual mode pin multiplexing or even triple mode pin multiplexing to be implemented. That is, either one, two or three functions may work at a given time with the same pin group.

What is claimed is:

1. A semiconductor device for multiplexing across a plurality of Input/Output (I/O) pins, the semiconductor device comprising:
a first core within the semiconductor device for operation of a first function;
a second core within the semiconductor device for operation of a second function;
a multiplexer arranged to set the I/O pins to the first function or to the second function at power up; and a hardware module comprising an arbiter arranged to receive requests from the cores for use of the I/O pins, and to grant use of the I/O pins to a selected core, as required on the fly without the need for a power restart.

2. The semiconductor device of claim 1 wherein the hardware module is operable at a first logic setting or a second logic setting wherein, at the first logic setting, the I/O pins are set to the function selected by the multiplexer at power up and, at the second logic setting, the arbiter sets the I/O pins to the function of the selected core.

3. The semiconductor device of claim 1 wherein the multiplexer is arranged to set the I/O pins to a preselected one of the first and the second function at power up.

4. The semiconductor device of claim 1 arranged to operate with a third core for operation of a third function.

5. The semiconductor device of claim 4 comprising the third core.

6. The semiconductor device of claim 1 wherein each request from a core comprises an active signal from the core to the arbiter.

7. The semiconductor device of claim 1 wherein each grant to a selected core comprises an active signal from the arbiter to the selected core.

8. A hardware module for a semiconductor device for multiplexing across a plurality of Input/Output (I/O) pins, the semiconductor device comprising a first core within the semiconductor device for operation of a first function, a second core within the semiconductor device for operation of a second function and a multiplexer arranged to set the I/O pins to the first function or to the second function at power up, the hardware module comprising an arbiter arranged to receive requests from the cores for use of the I/O pins, and to grant use of the I/O pins to a selected core, as required on the fly without the need for a power restart.

9. The hardware module of claim 8 wherein the hardware module is operable at a first logic setting or a second logic setting wherein, at the first logic setting, the I/O pins are set to the function selected by the multiplexer at power up and, at the second logic setting, the arbiter sets the I/O pins to the function of the selected core.

10. The hardware module of claim 8 further comprising an interface for one or each care for communicating with the arbiter.

11. A method for multiplexing across a plurality of Input/Output (I/O) pins, between a first core and a second core within the semiconductor device a semiconductor device, the first care being arranged far operation of a first function, the second core being arranged for operation of a second function, the method comprising the steps of:
 a) providing a hardware module within the semiconductor device, the hardware module comprising an arbiter;
 b) the first core and/or the second core sending a request to the arbiter for use of the I/O pins;
 c) the arbiter granting the request of a selected core as required on the fly without the need for a power restart; and
 d) the selected core receiving and/or sending data over the I/O pins.

12. The method of claim 11 wherein step b) comprises the first core and/or the second core setting a request signal to active.

13. The method of claim 11 wherein step c) comprises the arbiter setting a grant signal active for the selected core.

14. The method of claim 11 further comprising, before step d), the step of the selected core setting a busy signal to active.

15. The method of claim 14 wherein the selected core maintains the busy signal active while the selected core sends and/or receives data over the I/O pins.

16. The method of claim 14 wherein the selected core sets the busy signal to inactive once step d) is complete.

17. A semiconductor device for multiplexing across a plurality of Input/Output (I/O) pins, the semiconductor device comprising a Flash core; a PCI (Peripheral Component Interconnect) core; a multiplexer arranged to set the I/O pins to Flash function at power up; and a hardware module comprising a PCI arbiter and a modified Flash arbiter, the PCI arbiter arranged to receive requests from the Flash core and the PCI core for use of the I/O pins and to grant use of the I/O pins to a selected core as required, the modified Flash arbiter being arranged to interface between the Flash core and the PCI arbiter.

* * * * *